(12) United States Patent
Bobba et al.

(10) Patent No.: US 6,687,886 B2
(45) Date of Patent: Feb. 3, 2004

(54) LOGIC OPTIMIZATION FOR PREFERENTIAL SHIELDS

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 111 days.

(21) Appl. No.: 09/997,864

(22) Filed: Nov. 30, 2001

(65) Prior Publication Data

US 2003/0106031 A1 Jun. 5, 2003

(51) Int. Cl.$^7$ .............................................. G06F 17/50
(52) U.S. Cl. .................................. 716/5; 716/4; 716/6
(58) Field of Search ........................................ 716/4–18

(56) References Cited

U.S. PATENT DOCUMENTS

| 5,027,321 | A | | 6/1991 | Park ............................ 365/185 |
| 6,229,095 | B1 | | 5/2001 | Kobayashi ................... 174/255 |
| 6,353,917 | B1 | * | 3/2002 | Muddu et al. .................. 716/6 |
| 6,510,545 | B1 | * | 1/2003 | Yee et al. ..................... 716/12 |

FOREIGN PATENT DOCUMENTS

EP        0575892 A1       12/1993

OTHER PUBLICATIONS

Chhal et al., "A Novel Integrated Decoupling Capacitor For MCM–L Technology ", IEEE, May 1988, PP. 184–193.*
Notification of Transmittal of the International Search Report or the Declaration dated May 7, 2003 (2 pages).

* cited by examiner

*Primary Examiner*—Vuthe Siek
(74) *Attorney, Agent, or Firm*—Rosenthal & Osha L.L.P.

(57) ABSTRACT

A method that preferentially shields a signal to increase decoupling capacitance is provided. The signal is preferentially shielded based on a probability of the signal being at a specific value. Because the shield may also be used to form the power and ground grid, a balanced number of power versus ground lines is desired. A method for inverting the signal to balance the number of power versus ground lines is provided. Further, a method to increase system performance by increasing implicit decoupling capacitance is provided.

14 Claims, 5 Drawing Sheets

LOGIC OPTIMIZATION FOR PREFERENTIAL SHIELDS

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor (10) and some form of memory (20). The microprocessor (10) has, among other components, a central processing unit (also known and referred to as "CPU" or "execution unit") (12) and a memory controller (also known as "load/store unit") (14). The CPU (12) is where the actual arithmetic and logical operations of the computer system take place. To facilitate the execution of operations by the CPU (12), the memory controller (14) provides the CPU (12) with necessary instructions and data from the memory (20). The memory controller (14) also stores information generated by the CPU (12) into the memory (20).

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modern computers has increased as a consequence of increased operating frequencies. Thus, providing power to the components in a computer system in a sufficient and timely manner has become an issue of significant importance.

Often, power supplied to a computer system component varies, which, in turn, affects the integrity of the component's output. Typically, this power variation results from the distance between a power supply for the component and the component itself. This distance may lead to the component not receiving power (via current) at the exact time it is required. One approach used by designers to combat this performance-inhibiting behavior is introducing decoupling capacitance (also referred to as "decap") to a particular circuit by positioning one or more decoupling capacitors close to the component. These decoupling capacitors store charge from the power supply and distribute the charge to the component when needed. For example, if power received by a component from a power supply attenuates, one or more decoupling capacitors will distribute charge to the component to ensure that the component is not affected by the power variation on the power supply. In essence, a decoupling capacitor acts as a local power supply for one or more specific components in a computer system.

Within a computer system component, such as a circuit, there are two types of decoupling capacitance: implicit and explicit. Explicit decoupling capacitance is provided to the circuit through the use of decoupling capacitors as discussed above. Implicit decoupling capacitance (also known in the art as "parasitic capacitance" or "inherent capacitance") is capacitance that is inherent in a circuit. Implicit decoupling capacitance results from the electromagnetic effects between current-carrying wires. Further, implicit decoupling capacitance is a function of the distance between two such wires. Also, the ability to help supplement an attenuating voltage using explicit decoupling capacitors or implicit decoupling capacitance is a function of the potential applied to the decaps.

FIG. 2 shows the presence of explicit and implicit decoupling capacitance in a section of a typical computer system component (40). The component (40) has a power supply bus (44) and a ground bus (46) that provides power through a connection to a power supply (42). The power supply (42) may be a part of the component (40) or a separate element. Power from the power supply (42) is made available to multiple power supply lines (48) and (52) via connections to the power supply bus (44) and to multiple ground lines (50) and (54) via connections to the ground bus (46). Power from the power supply (42) is delivered to chip logic circuits (60) and (68) via the power supply lines (48) and (52), respectively, and ground lines (50) and (54), respectively. When there is power variation across the power supply (42), explicit decoupling capacitors (56), (57), (58), and (59) positioned in parallel with the power supply (42) provides charge, i.e., power, to the chip logic circuits (60) and (68).

Still referring to FIG. 2, the existence of implicit decoupling capacitances (64), (66), (72), and (74) is shown. A first occurrence of implicit decoupling capacitance (64) occurs between the power supply line (48) and a signal line (62) from the chip logic (60). A second occurrence of implicit decoupling capacitance (66) occurs between the signal line (62) and the ground line (50). The implicit decoupling capacitances (64) and (66) are dependent on the characteristics of the signal line (62), specifically, whether a signal on the signal line (62) is high or low. When the signal is low, the implicit decoupling capacitance provided to the chip logic (60) is equal to the implicit decoupling capacitance (64) between the power supply line (48) and the signal line (62). Alternatively, when the signal is high, the implicit decoupling capacitance provided to the chip logic (60) is equal to the implicit decoupling capacitance (66) between the signal line (62) and the ground line (50).

Still referring to FIG. 2, implicit decoupling capacitance is also present in a substantial number of additional circuits. For example, another first occurrence of implicit decoupling capacitance (72) occurs between the power supply line (52) and a signal line (70) from the chip logic (68). Another second occurrence of implicit decoupling capacitance (74) occurs between the signal line (70) and the ground line (54). The implicit decoupling capacitances (72) and (74) are dependent on the characteristics of the signal line (70), specifically, whether a signal on the signal line (70) is high or low. When the signal is low, the implicit decoupling capacitance provided to the chip logic (68) is equal to the implicit decoupling capacitance (72) between the power supply line (52) and the signal line (70). Alternatively, when the signal is high, the implicit decoupling capacitance provided to the chip logic (68) is equal to the implicit decoupling capacitance (74) between the signal line (70) and the ground line (54).

SUMMARY OF INVENTION

According to one aspect of the present invention, a method for preferentially shielding a plurality of signal paths where each of the plurality of signal paths has a value switchable between a first potential and a second potential comprises determining a probability for each of the plurality of signal paths that the value will be at the first potential versus the second potential, assigning a shield to each of the plurality of signal paths where each shield is assigned a potential based upon the probability of the corresponding signal path, determining if an imbalanced state exists among the shields, and if the imbalanced state exists, inverting the value of one of the signal paths to reduce the imbalanced state.

Other aspects and advantages of the invention will be apparent from the following description and the appended claims.

DETAILED DESCRIPTION

Embodiments of the present invention relate to a circuit that uses preferential shielding to increase implicit decoupling capacitance. Embodiments of the present invention further relate to a method for increasing implicit decoupling capacitance. Embodiments of the present invention further relate to a means for increasing implicit decoupling capacitance. Embodiments of the present invention further relate to a computer system that preferentially shields a wire to increase system performance. Embodiments of the present invention further relate to a computer-readable medium having recorded thereon instructions executed by a processor for increasing implicit decoupling capacitance.

Figure 1:
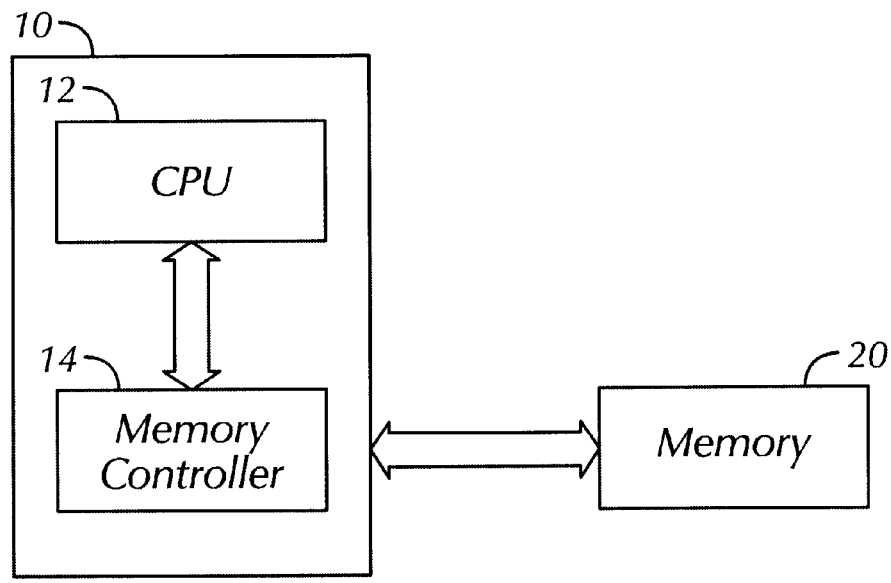
FIG. 1 shows a typical computer system.
Figure 2:
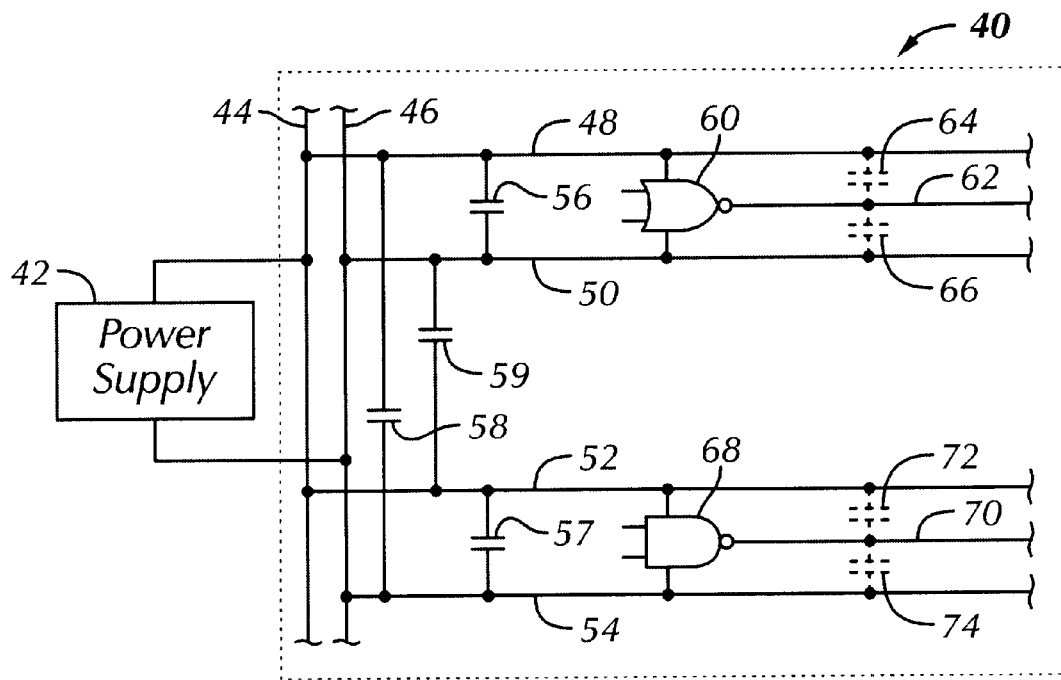
FIG. 2 shows a section of a typical computer system component.

In FIG. 2, during the course of normal operation of the computer system component (40), chip logic circuits (60) and (68) may generate a signal on signal lines (62) and (70) that statistically spends more time in either the high or low state. Depending on the statistical tendencies of the signal lines (62) and (70), the implicit decoupling capacitances (64) and (66) may not be equal, and the implicit decoupling capacitances (72) and (74) may not be equal, respectively.

As discussed above with reference to FIG. 2, a signal on the signal line may be high or low, and depending on the value of that signal, the amount of implicit decoupling capacitance present can be determined. In other words, the amount of implicit decoupling capacitance present on a signal line is a function of whether a signal on the signal line is high or low relative to a respective power supply or ground line. Regardless of whether a signal has a tendency to have a particular value, however, in the prior art the amount of implicit decoupling capacitance present will be equal to the amount of implicit decoupling capacitance that would be present if the signal had another value. In other words, no preference is given in assigning the potential of the lines near the signal line. For example, although a NOR gate under normal conditions has a tendency to output low, in the prior art the amount of implicit decoupling capacitance present will be the same for when the NOR gate outputs low and when the NOR gate outputs high.

The present invention takes into account a probability of a signal having a specific value. By knowing the probability, a signal line for the signal is shielded with a preferred potential to increase the implicit decoupling capacitance between the signal line and its shield. Because the shields may also be used to form the power and ground grid, a balanced number of power versus ground lines are required. Inversion of an appropriate number of signal lines will also invert the preferred potential on the shield. Balancing the number of high and low probability signal lines, balances the power and ground (shield) grid. By using the probability the signal is at a specific value, those skilled in the art will appreciate that the problem can be formulated to maximize the implicit decoupling capacitance by assignment, or inversion of the signal then assignment, of the shield potential.

Figure 3:
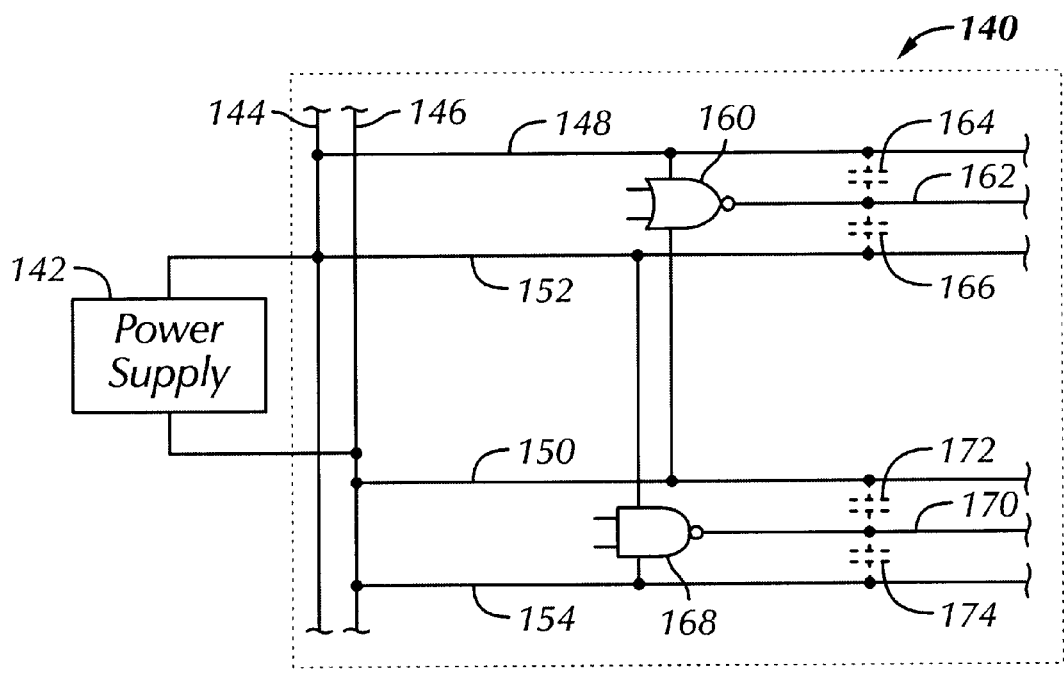
FIG. 3 shows a circuit in accordance with an embodiment of the present invention.

FIG. 3 shows an exemplary circuit (140) in accordance with an embodiment of the present invention. The circuit (140) has a power supply bus (144) and a ground bus (146) that provides power to a two-input NOR gate (160) through a power supply line (148) and a ground line (150). The power supply (142) may be a part of the circuit (140) or a separate element. Power from the power supply (142) is made available to multiple power supply lines (148) and (152) via connections to the power supply bus (144) and to multiple ground lines (150) and (154) via connections to the ground bus (146). Power from the power supply (142) is delivered to chip logic circuits (160) and (168) via the power supply lines (148) and (152), respectively, and ground lines (150) and (154), respectively. The two-input NOR gate (160) outputs a signal on a signal line, or signal path, (162). The implicit decoupling capacitance is equal to the implicit decoupling capacitance (164) between the signal line (162) and the power supply line (148), acting as a first shield, plus the implicit decoupling capacitance (166) between the signal line (162) and the power supply line (152), acting as a second shield, while the signal line (162) is low. The implicit decoupling capacitance is essentially zero while the signal line (162) is high. This relationship may be represented as shown in Equation 1:

$$C_{IMP}=(Decap_1+Decap_2) \text{ when Signal Line=low,}$$

$$C_{IMP}=0 \text{ when Signal Line=high,} \quad \text{(Equation 1)}$$

where $Decap_1$ is equal to the implicit decoupling capacitance (164) between the power supply line (148) and the signal line (162) when the signal line (162) is low, and where $Decap_2$ is equal to the implicit decoupling capacitance (166) between the power supply line (152) and the signal line (162) when the signal line (162) is low. When the signal line (162) is high, both the implicit decoupling capacitances (164) and (166) are essentially zero. From Equation 1, it is apparent that shielding the signal line (162) with power supply line (148) and power supply line (152) increases the amount of implicit decoupling capacitance. In fact, the longer signal line (162) is low, the greater the implicit decoupling capacitance, as shown in Equation 1. Equally stated, the average implicit decoupling capacitance over time is the probability the signal line (162) is low times the implicit decoupling capacitance when the signal line (162) is low, as defined in Equation 1. The average decoupling capacitance $AvgC_{IMP}$ is:

$$AvgC_{IMP}=P_L*(Decap_1+Decap_2), \quad \text{(Equation 2)}$$

where $P_L$ is equal to the probability that the signal is low. From Equation 2, it is apparent that in order to maximize the amount of implicit decoupling capacitance, the implicit decoupling capacitance is increased for the situation that has the higher probability on the signal line (162).

Of the four possible input combinations to the NOR gate (160), only one combination causes the NOR gate (160) to output high. The other three input combinations cause the NOR gate (160) to output low. Assuming an independent and evenly distributed probability for the inputs to the NOR gate (160), the probability that a signal outputted from the NOR gate (160) is high is 0.25 and the probability that a signal outputted from the NOR gate (160) is low is 0.75. Accordingly, the signal from the NOR gate (160) is said to be "predominantly low."

In order to maximize the amount of implicit decoupling capacitance on the signal line (162) according to Equation 2, the signal line (162) is shielded such that both of the shielding lines (148) and (152) are connected to the power supply bus (144). The signal on the signal line (162) is three times more likely to be low; therefore, the implicit decoupling capacitance created by implicit decoupling capacitance (164) and implicit decoupling capacitance (166) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that power supply line (148) and power supply line (152) act as shields. Further, those skilled in the art will appreciate that a different potential can be used on shielding line (148) and shielding line (152). Those skilled in the art will also appreciate that only one shielding line (148) or shielding line (152) may be used.

Still referring to FIG. 3, the exemplary circuit (140) is also provided with a two-input NAND gate (168) that receives power from the power supply bus (144) and from the ground bus (146) via power supply line (152) and ground line (154). The two-input NAND gate (168) outputs a signal on a signal line, or signal path, (170). The implicit decoupling capacitance is equal to the implicit decoupling capacitance (172) between the signal line (170) and the ground line (150), acting as a first shield, plus the implicit decoupling capacitance (174) between the signal line (170) and the ground line (154), acting as a second shield, while the signal line (170) is high. The implicit decoupling capacitance is essentially zero while the signal line (170) is low. This relationship may be represented as shown in Equation 3:

$$C_{IMP}=(Decap_1+Decap_2) \text{ when Signal Line=high,}$$

$$C_{IMP}=0 \text{ when Signal Line=low,} \quad \text{(Equation 3)}$$

where $Decap_1$ is equal to the implicit decoupling capacitance (172) between the ground line (150) and the signal line (170) is high, and where $Decap_2$ is equal to the implicit decoupling capacitance (174) between the ground line (154) and the signal line (170) when the signal line (170) is high. When the signal line (170) is low, both the implicit decoupling capacitances (172) and (174) are essentially zero. From Equation 3, it is apparent that that shielding signal line (170) with ground line (150) and ground line (154) increases the amount of implicit decoupling capacitance. In fact, the longer signal line (170) is high, the greater the implicit decoupling capacitance, as shown in Equation 3. Equally stated, the average implicit decoupling capacitance over time is the probability the signal line (170) is high times the implicit decoupling capacitance when the signal line (170) is high, as defined in Equation 3. The average decoupling capacitance $AvgC_{IMP}$ is:

$$AvgC_{IMP}=P_H*(Decap_1+Decap_2), \quad \text{(Equation 4)}$$

where $P_H$ is equal to the probability that the signal is high. From Equation 4, it is apparent that in order to maximize the amount of implicit decoupling capacitance, the implicit decoupling capacitance is increased for the situation that has the higher probability on the signal line (170).

Of the four possible input combinations to the NAND gate (168), only one combination causes the NAND gate (168) to output low. The other three input combinations cause the NAND gate (168) to output high. Assuming an independent and evenly distributed probability for the inputs to the NAND gate (168), the probability that a signal outputted from the NAND gate (168) is low is 0.25 and the probability that a signal outputted from the NAND gate (168) is high is 0.75. Accordingly, the signal from the NAND gate (168) is said to be "predominantly high."

In order to maximize the amount of implicit decoupling capacitance on the signal line (170) according to Equation 4, the signal line (170) is shielded such that both of the shielding lines (150) and (154) are connected to the ground bus (146). The signal on the signal line (170) is three times more likely to be high; therefore, the implicit decoupling capacitance created by implicit decoupling capacitance (172) and implicit decoupling capacitance (174) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Those skilled in the art will appreciate that ground line (150) and ground line (154) act as shields. Further, those skilled in the art will appreciate that a different potential can be used on shielding line (150) and shielding line (154). Those skilled in the art will also appreciate that only one shielding line (150) or shielding line (154) may be used.

By way of comparison, the average implicit decoupling capacitance in FIG. 2 and FIG. 3 are calculated assuming independent and evenly distributed probability for the inputs to all logic circuits, and the implicit decoupling capacitors are of equal value that are now referred to simply as "Decap". For FIG. 2, the signal line (62) has a 0.25 probability of being high and a 0.75 probability of being low. Accordingly, the average implicit decoupling capacitance is 0.25 Decap to the ground line (50) and 0.75 Decap to the power supply line (48). Likewise in FIG. 2, the signal line (70) has a 0.25 probability of being low and a 0.75 probability of being high. Accordingly, the average implicit decoupling capacitance is 0.25 Decap to the power supply line (52) and 0.75 Decap to the ground line (54). Essentially, the power supply lines (48) and (52) combined see one Decap and the ground lines (50) and (54) combined see one Decap. For FIG. 3, the signal line (162) has a 0.25 probability of being high and a 0.75 probability of being low. Accordingly, the average implicit decoupling capacitance is 0.75*2*Decap, or 1.5 Decap, to power supply lines (148) and (152). Likewise in FIG. 3, the signal line (170) has a 0.25 probability of being low and a 0.75 probability of being high. Accordingly, the average implicit decoupling capacitance is 0.75*2*Decap, or 1.5 Decap, to ground lines (150) and (154). Those skilled in the art will appreciate that shielding the signal lines (162) and (170) with a preferential potential on the shielding lines in this manner increases the implicit decoupling capacitance associated with the signal lines (162) and (170).

Those skilled in the art will appreciate that although the embodiments shown in FIG. 3 use two-input logic gates, circuit logic having any number of inputs may be used, generally referred to as combinational logic. All that is required is that one be able to ascertain the probability of a value on an output signal from particular circuit logic. Further, those skilled in the art will appreciate that the embodiments shown in FIG. 3 may reside in an integrated circuit or other electrical component.

Figure 4:
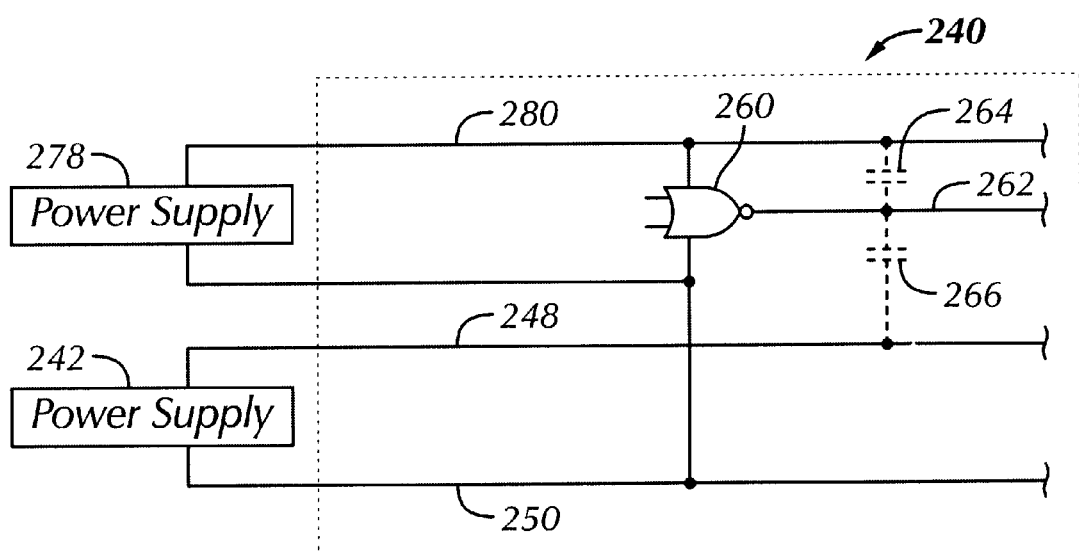
FIG. 4 shows a circuit in accordance with another embodiment of the present invention.

FIG. 4 shows an exemplary circuit (240) in accordance with an embodiment of the present invention. The circuit (240) has a power supply line (280) and a ground line (250) that provides power to, in this example, a two-input NOR gate (260). Power is provided to the power supply line (280) and the ground line (250) through a power supply (278). The power supply (278) may be a part of circuit (240) or a separate element. A power supply (242) also exists that supplies power through power supply line (248) and a ground line (250). The power supply (242) may be a part of circuit (240) or a separate element. In this embodiment, the ground line is common between both power supply (278) and power supply (242). Those skilled in the art will appreciate that the ground line (250) may actually be multiple lines that do not physically connect to one another. The two-input NOR gate (260) outputs a signal on a signal line, or signal path, (262). The implicit decoupling capacitance is equal to the implicit decoupling capacitance (264) between the signal line (262) and the power supply line (280), acting as a first shield, plus the implicit decoupling capacitance (266) between the signal line (262) and the power supply line (248), acting as a second shield, while the signal line (262) is low. The implicit decoupling capacitance is essentially zero while the signal line (262) is high. This relationship may be represented as shown in Equation 5:

$$C_{IMP}=(Decap_1+Decap_2) \text{ when Signal Line=low,}$$

$$C_{IMP}=0 \text{ when Signal Line=high,} \qquad \text{(Equation 5)}$$

where $Decap_1$ is equal to the implicit decoupling capacitance (264) between the power supply line (280) and the signal line (262) when the signal line (262) is low, and where $Decap_2$ is equal to the implicit decoupling capacitance (266) between the power supply line (248) and the signal line (262) when the signal line (262) is low. When the signal line (262) is high, both the implicit decoupling capacitances (264) and (266) are essentially zero. From Equation 5, it is apparent that shielding signal line (262) with power supply line (280) and power supply line (248) increases the amount of implicit decoupling capacitance. In fact, the longer signal line (262) is low, the greater the implicit decoupling capacitance, as shown in Equation 5. Equally stated, the average implicit decoupling capacitance over time is the probability the signal line (262) is low times the implicit decoupling capacitance when the signal line (262) is low, as defined in Equation 5. The average decoupling capacitance $AvgC_{IMP}$ is:

$$AvgC_{IMP}=P_L*(Decap_1+Decap_2), \qquad \text{(Equation 6)}$$

where $P_L$ is equal to the probability that the signal is low. From Equation 6, it is apparent that in order to maximize the amount of implicit decoupling capacitance, the implicit decoupling capacitance is increased for the situation that has the higher probability on the signal line (262).

Of the four possible input combinations to the NOR gate (260), only one combination causes the NOR gate (260) to output high. The other three input combinations cause the NOR gate (260) to output low. Assuming an independent and evenly distributed probability for the inputs to the NOR gate (260), the probability that a signal outputted from the NOR gate (260) is high is 0.25 and the probability that a signal outputted from the NOR gate (260) is low is 0.75. Accordingly, the signal from the NOR gate (260) is said to be "predominantly low."

In order to maximize the amount of implicit decoupling capacitance on the signal line (262) according to Equation 6, the signal line (262) is shielded such that both of the shielding lines (280) and (248) are connected to the power supplies (278) and (242), respectively. The signal on signal line (262) is three times more likely to be low; therefore, the implicit decoupling capacitance created by implicit decoupling capacitance (264) and implicit decoupling capacitance (266) exists 75% of the time and provides essentially no implicit decoupling capacitance only 25% of the time.

Those skilled in the art will appreciate that shield assignment, whether it is with a power supply line and a ground line, with a power supply line and a power supply line, or with a ground line and a ground line, the delay of the signal on the signal line does not change. Using preferential shielding, therefore, does not increase the signal delay compared to typical shielding arrangements. By creating an imbalance in the implicit decoupling capacitance based on the probability the signal is at a specific value, the amount of implicit decoupling capacitance is increased.

Still referring to FIG. 4, the power supply (278) connects to the implicit decoupling capacitance (264) through shielding line (280), and power supply (242) connects to the implicit decoupling capacitance (266) through shielding line (248). The power supplies (278) and (242) are not required to operate at the same potential. Consequently, the decoupling ability of the implicit decoupling capacitance (264) and the implicit decoupling capacitance (266) may not be same due to the stored charge differences. Those skilled in the art will appreciate that shielding the signal line (262) with one or more preferential potentials on the shielding lines in this manner increases the ability of the implicit decoupling capacitance associated with the signal line (262) to maintain the potential on the shielding lines. Those skilled in the art will also appreciate that only one shielding line (280) or shielding line (248) may be used.

Those skilled in the art will appreciate that although the embodiments shown in FIG. 4 use a two-input logic gate, circuit logic having any number of inputs may be used, generally referred to as combinational logic. Also, although a NAND gate is used for purposes of illustration, any type of logic gate may be used. All that is required is that one be able to ascertain the probability of a value on an output signal from particular circuit logic. Further, those skilled in the art will appreciate that the embodiments shown in FIG. 4 may reside in an integrated circuit or other electrical component.

Figure 5:
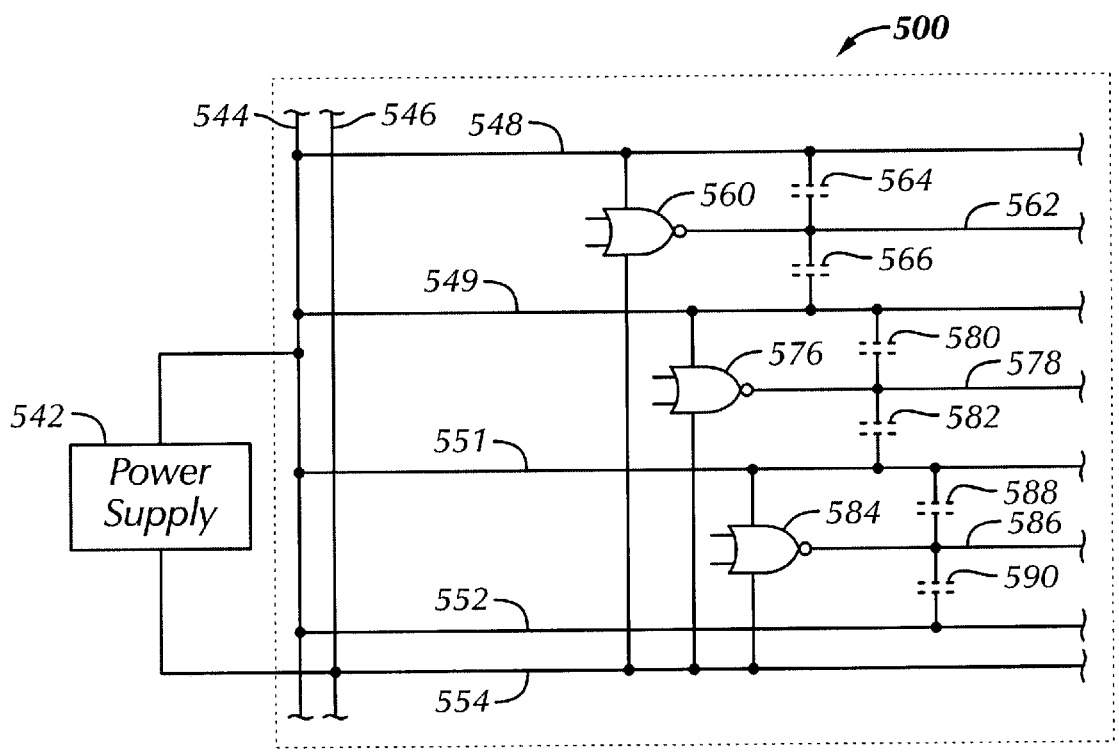
FIG. 5 shows a circuit in accordance with an embodiment of the present invention.

In the design of an integrated circuit, it is not uncommon to have a large number of connecting lines to connect one element to another. A large number of power lines may also be used to transmit power and act as shields for the connecting lines. FIG. 5 shows an exemplary circuit (500) in accordance with an embodiment of the present invention. The circuit (500) has a power supply bus (544) and a ground bus (546) that provide power to three two-input NOR gates (560, 576, 584) through a power supply line (548, 549, 551), respectively, and a ground line (554). The power supply (542) may be a part of the circuit (500) or a separate element. Power from the power supply (542) is made available to multiple power supply lines (548, 549, 551, 552) via connections to the power supply bus (544) and to the ground line (554) via connection to the ground bus (546).

The three two-input NOR gates (560, 576, 584) output a signal on signal lines (562, 578, 586), respectively. As above, the implicit decoupling capacitance is equal to the implicit decoupling capacitances (564, 566) between the signal line (562) and the power supply lines (548, 549), respectively. Additional implicit decoupling capacitance is available from the implicit decoupling capacitances (580, 582) between the signal line (578) and the power supply lines (549, 551), respectively. Implicit decoupling capacitance is also available from the implicit decoupling capacitances (588, 590) between the signal line (586) and the power supply lines (551, 552), respectively.

Of the four possible input combinations to the two-input NOR gates (560, 576, 584), only one combination causes the NOR gates (560, 576, 584) to output high. The other three input combinations cause the NOR gates (560, 576, 584) to output low. Assuming an independent and evenly distributed probability for the inputs to the NOR gates (560, 576, 584), the probability that a signal outputted from the NOR gates (560, 576, 584) is high is 0.25 and the probability that a signal outputted from the NOR gates (560, 576, 584) is low is 0.75. Accordingly, the signals from the three NOR gates (560, 576, 584) are said to be "predominantly low."

In order to maximize the amount of implicit decoupling capacitance on the signal lines (562, 578, 586) as taught above, the signal lines (562, 578, 586) are shielded such that the shielding lines (548, 549, 551, 552) are connected to the power supply bus (544). The signal on the signal lines (562, 578, 586) are three times more likely to be low; therefore, the implicit decoupling capacitance created by implicit decoupling capacitances (564, 566, 580,582, 588, 590) exists 75% of the time and provides essentially no implicit decoupling capacitance only 25% of the time.

Those skilled in the art will appreciate that power supply lines (548, 549, 551, 552) act as shields. Further, those skilled in the art will appreciate that a different potential can be used on shielding lines (548, 549, 551, 552). Those skilled in the art will also appreciate that not all of the shielding lines (548, 549, 551, 552) must be used. Additionally, those skilled in the art will appreciate that although the embodiments shown in FIG. 5 use a two-input logic gate, circuit logic having any number of inputs may be used, generally referred to as combinational logic. Also, although a NOR gate is used for purposes of illustration, any type of logic gate may be used. All that is required is that one be able to ascertain the probability of a value on an output signal from particular circuit logic. Further, those skilled in the art will appreciate that the embodiments shown in FIG. 5 may reside in an integrated circuit or other electrical component.

Figure 6:
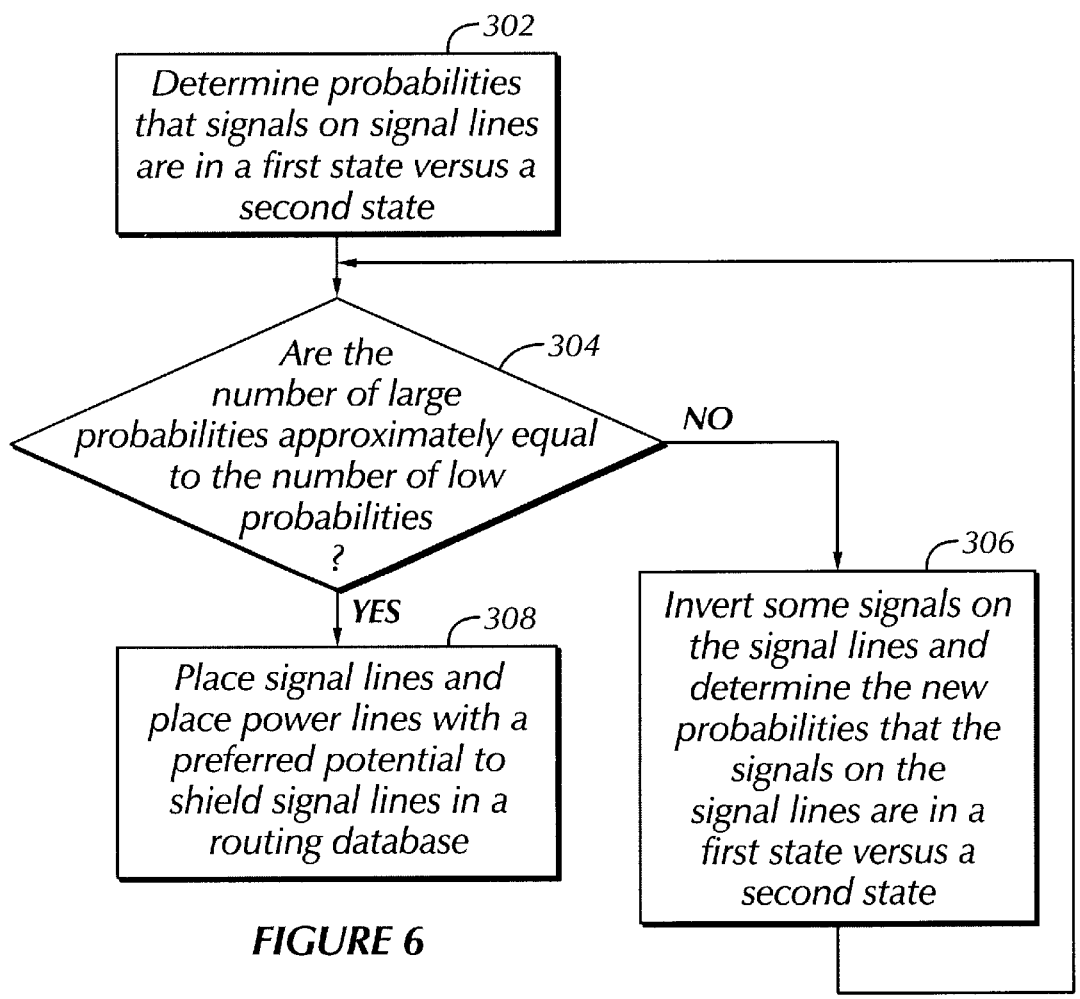
FIG. 6 shows a flow process in accordance with some embodiments of the present invention.

In FIG. 5, due to the probabilities of the signals on the signal lines (562, 578, 586), more power supply lines (548, 549, 551, 552) exist than ground lines (554). The disproportionate number of power supply lines versus ground lines causes an imbalanced state. In a further optimization of an embodiment of the present invention, FIG. 6 shows a flow process in accordance with an embodiment of the present invention. The flow process shows how an embodiment of the present invention balances the number of power supply lines and ground lines while still providing a preferred potential to the shielding lines to increase the implicit decoupling capacitance of the signal lines.

In step 302, the probability that signals on the signal lines from the combinational logic are in a first state versus a second state is determined. In step 304, the number of large probabilities and small probabilities are compared. If the number of large probabilities is approximately equal to the number of small probabilities, step 308 is followed. Otherwise, step 306 is followed. In step 306, inversion of the output of some of the signals occurs and the number of large versus small probabilities is again determined. Again, a comparison is made in step 304. Step 304 and step 306 are repeated as necessary. In step 308, the signal lines and power lines with a preferred potential are routed, or placed, in a routing database for eventual use in the manufacture of an integrated circuit or electrical component.

Those skilled in the art will appreciate that a balanced number of power supply and ground lines are generally required. Those skilled in the art will also appreciate that the inversion of a signal changes a "predominantly low" signal to a "predominantly high" signal, and vice versa. Those skilled in the art will further appreciate that the inversion of a signal may be incorporated into the logic optimization of the combinational logic at both the transmitting and receiving ends of the signal. Those skilled in the art will additionally appreciate that the number of inversions required is known in step 304, so that step 306 may invert the correct number of signals on the signal lines, and step 308 follows.

Figure 7:
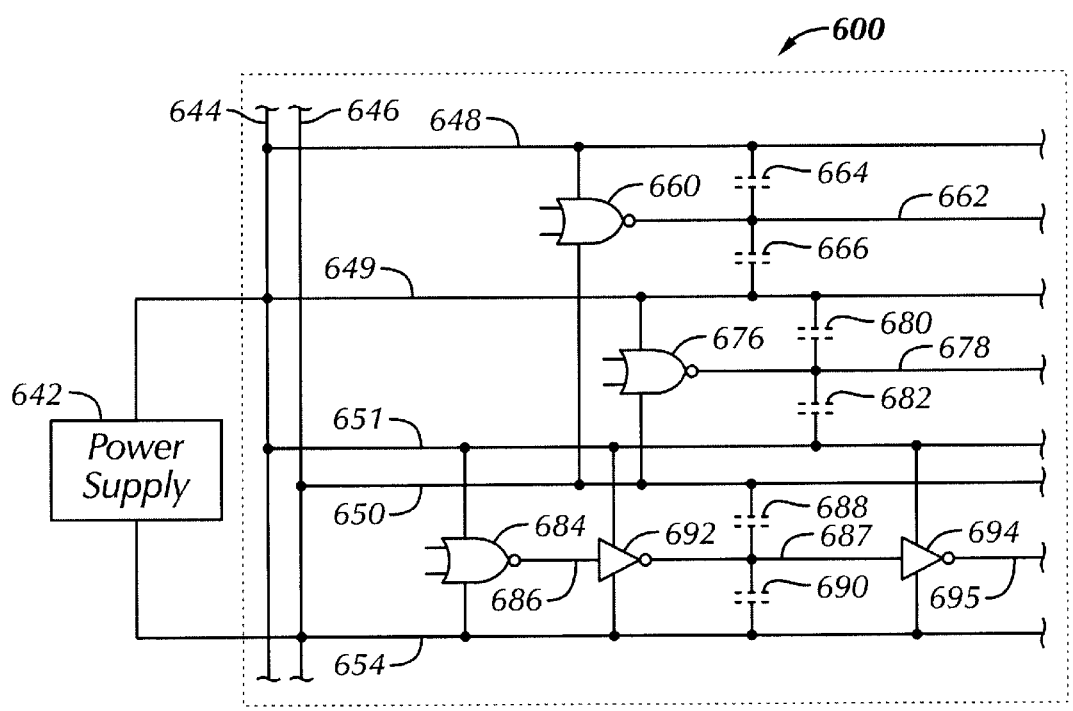
FIG. 7 shows a circuit in accordance with another embodiment of the present invention.

FIG. 7 shows an exemplary circuit (600) in accordance with an embodiment of the present invention. The circuit (600) has a power supply bus (644) that provides power to three two-input NOR gates (660, 676, 684) through a power supply lines (648, 649, 651), respectively. The circuit (600) also has a ground bus (646) that provides power to two two-input NOR gates (660, 676) through a ground line (650) and to one two-input NOR gate (684) through a ground line (654). A power supply (642) may be part of the circuit (600) or a separate element. Power from the power supply (642) is made available to multiple power supply lines (648, 649, 651) via connections to the power supply bus (644) and to multiple ground lines (650, 654) via connections to the ground bus (646).

Still referring to FIG. 7, the circuit (600) has been optimized according to the flow process in FIG. 6. The differences are evident to those skilled in the art when compared to FIG. 5. In FIG. 7, the signal on a signal line (686) from the NOR gate (684) has been inverted by the addition of an inverter logic circuit (692). The inverter logic circuit (692) generates a signal on a signal line (687). To provide a signal with the same polarity to a receiving circuit, inverter logic circuit (694) is placed close to the receiving circuit (not shown). The two two-input NOR gates (660, 676) output a signal on signal lines (662, 678), respectively. The two-input NOR gate (684) outputs an inverted signal on signal line (687). The implicit decoupling capacitance is equal to the implicit decoupling capacitances (664, 666) between the signal line (662) and the power supply lines (648, 649), respectively. Additional implicit decoupling capacitance is available from the implicit decoupling capacitances (680, 682) between the signal line (678) and the power supply lines (649, 651), respectively. Implicit decoupling capacitance is also available from the implicit decoupling capacitances (688, 690) between the signal line (687) and the ground lines (650, 654), respectively.

Of the four possible input combinations to the two-input NOR gates (660, 676), only one combination causes the NOR gates (660, 676) to output high. The other three input combinations cause the NOR gates (660, 676) to output low. Assuming an independent and evenly distributed probability for the inputs to the NOR gates (660, 676), the probability that a signal outputted from the NOR gates (660, 676) is high is 0.25 and the probability that a signal outputted from the NOR gates (660, 676) is low is 0.75. Accordingly, the signals from the two NOR gates (660, 676) is said to be "predominantly low."

The combination of the two-input NOR gate (684) and the inverter logic circuit (692) creates a logic function equivalent to an OR gate. Of the four possible input combinations to the two-input NOR gate (684) combined with the inverter logic circuit (692), one combination causes a low while the other three combinations cause a high. Accordingly, the signal from the NOR gate (684) combined with the logic inverter circuit (692) is said to be "predominantly high."

In order to maximize the amount of implicit decoupling capacitance on the signal lines (662, 678, 687) as taught above, the signal lines (662, 678) are shielded such that the shielding lines (648, 649, 651) are connected to the power supply bus (644). The signals on the signal lines (662, 678) are three times more likely to be low; therefore, the implicit decoupling capacitance created by implicit decoupling capacitances (664, 666, 680, 682) exists 75% of the time and provides essentially no implicit decoupling capacitance only 25% of the time. The signal line (687) is shielded such that the shielding lines (650, 654) are connected to the ground bus (646). The signal on the signal line (687) is three times more likely to be high; therefore, the implicit decoupling capacitance created by implicit decoupling capacitances (688, 690) exists 75% of the time and provides essentially no implicit decoupling capacitance only 25% of the time.

Those skilled in the art will appreciate that the inversion of a signal line, and use of the preferred shielding potential, balances the number of power supply lines and ground lines. Those skilled in the art will also appreciate that power supply lines (648, 649, 651) and ground lines (650, 654) act as shields. Further, those skilled in the art will appreciate that a different potential can be used on shielding lines (648, 649, 651). Those skilled in the art will also appreciate that not all of the shielding lines (648, 649, 651) must be used. Further, those skilled in the art will appreciate that although the embodiments shown in FIG. 7 use a two-input logic gate, circuit logic having any number of inputs may be used, generally referred to as combinational logic. Also, although a NOR gate is used for purposes of illustration, any type of logic gate may be used. All that is required is that one be able to ascertain the probability of a value on an output signal from particular circuit logic. Further, those skilled in the art will appreciate that the embodiments shown in FIG. 7 may reside in an integrated circuit or other electrical component.

Those skilled in art will appreciate that the addition of the inverter logic circuit (692) near the transmitting circuit and the inverter logic circuit (694) near the receiving circuit may be included in the adjacent logic; therefore, the inversion may be part of the logic optimization. Those skilled in art will further appreciate that an inversion logic circuit may reside anywhere along the signal line, and may be used along with preferential shielding similar or dissimilar than the preferential shielding used at the origination or termination of the signal. Furthermore, those skilled in art will appreciate that multiple inverter logic circuits may be used along a signal line with preferential shielding available for only portions of the signal line.

Those skilled in art will appreciate that a power supply may transmit any potential, including ground.

Advantages of the present invention may include one or more of the following. In some embodiments, because a signal is preferentially shielded, a circuit may have more decoupling capacitance than when the signal is not shielded by a preferred potential.

In some embodiments, because a signal is shielded with a preferred potential, increased decoupling capacitance is provided to one or more components in a computer system, effectively leading to better system performance.

In some embodiments, because implicit decoupling capacitance is increased through preferential shielding, fewer explicit decoupling capacitors are needed, and thus, more components may be positioned on an integrated circuit.

In some embodiments, because implicit decoupling capacitance is higher, the number of explicit decoupling capacitors that must be added is reduced; therefore, a smaller integrated circuit die may be used.

In some embodiments, signals lines are inverted to balance the number of power supply lines and ground lines while a signal is shielded with a preferred potential; therefore, increased decoupling capacitance is provided to one or more components in a computer system, thus effectively leading to better system performance.

In some embodiments, signals lines are inverted to balance the number of power supply lines and ground lines while implicit decoupling capacitance is increased through preferential shielding; therefore, fewer explicit decoupling capacitors are needed, and thus, more components may be positioned on an integrated circuit.

In some embodiments, signals lines are inverted to balance the number of power supply lines and ground lines while increasing the implicit decoupling capacitance; therefore, the number of explicit decoupling capacitors that must be added is reduced; therefore, a smaller integrated circuit die may be used.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for preferentially shielding a plurality of signal paths, wherein each of the plurality of signal paths has a value switchable between a first potential and a second potential, the method comprising;
   determining a probability for each of the plurality of signal paths that the value will be at the first potential versus the second potential;
   assigning a shield to each of the plurality of signal paths, wherein each shield is assigned a potential based upon the probability of the corresponding signal path;
   determining if an imbalanced state exists among the shields; and
   if the imbalanced state exists, inverting the value of one of the signal paths to reduce the imbalanced state.

2. The method of claim 1, wherein, for each of the plurality of signal paths, the shield is assigned a third potential closer in value to the first potential than to the second potential when the probability of the value of the signal being at the second potential is greater.

3. The method of claim 1, wherein, for each of the plurality of signal paths, the shield is assigned a fourth potential closer in value to the second potential than to the first potential when the probability of the value of the signal being at the first potential is greater.

4. The method of claim 1, wherein at least one shield is operatively connected to a power supply.

5. The method of claim 1, wherein the signal path is operatively connected to a logic component.

6. The method of claim 1, wherein the first potential is a logic low and the second potential is a logic high.

7. The method of claim 1, wherein, for each of the plurality of signal paths, the shield is assigned one of a third potential and a fourth potential.

8. The method of claim 7, wherein the imbalanced state exists if more shields are at the third potential than the fourth potential.

9. The method of claim 7, wherein, for each of the plurality of signal paths, the shield is assigned the third potential closer in value to the first potential than to the second potential when the probability of the value of the signal being at the second potential is greater.

10. The method of claim 7, wherein, for each of the plurality of signal paths, the shield is assigned the fourth potential closer in value to the second potential than to the first potential when the probability of the value of the signal being at the first potential is greater.

11. The method of claim 7, wherein at least one shield is operatively connected to a power supply.

12. The method of claim 11, wherein the third potential is ground.

13. The method of claim 11, wherein the third potential is power.

14. The method of claim 1, further comprising:
- assigning a shield to the signal path having the inverted value;
- determining if the imbalanced state exists among the shields; and
- if the imbalanced state exists, inverting the value of another one of the signal paths to reduce the imbalanced state.

* * * * *